INVENTORS
K. FREI
H.K. HEINZ
BY
ATTORNEY.

3,431,503

DETECTORS FOR FREQUENCY MODULATED (FM) SIGNAL RECEIVERS HAVING PULSE GENERATING CIRCUITRY

Harro K. Heinz, Flushing, and Karl Frei, New York, N.Y., assignors to Fisher Radio Corporation, Long Island City, N.Y., a corporation of New York Filed Jan. 3, 1966, Ser. No. 518,459
U.S. Cl. 329—103 5 Claims
Int. Cl. H03d *1/18, 3/04;* H03k *3/00*

ABSTRACT OF THE DISCLOSURE

An FM demodulator, adapted to be connected to the intermediate frequency amplifier of an FM receiver, includes: a first pulse generator responsive to the FM signal for producing pulses having the same repetition rate as the frequency of the FM signal; a second pulse generator connected to the first pulse generator by an open-circuited delay line to stretch the width of the pulses produced by the second pulse generator; and connected to the output of the second pulse generator, and integrating circuit for recovering the information carried by the FM signal.

This invention relates to detectors for frequency modulated (FM) signal receivers.

Discriminators of the Foster-Seeley type, used in FM signal receivers, present certain problems in use. For example, such discriminators involve accurate tuning of the resonant circuits. As a receiver ages, properties of the tuned circuits change; the discriminator may fall out of alignment and thereby produce a distorted output signal. Furthermore, as the circuit elements of the discriminator heat up during normal use of the receiver, the values of the tuned elements change, and may produce "frequency drift," and require retuning of the receiver. Solutions have been sought to compensate for frequency drift, but have involved increased complexity and cost for the resultant receiver.

Certain means which may be utilized for the demodulation of FM signals may comprise a pulse-shaping network which converts the conventional FM signal, applied to the input terminals of the network, into pulses of equal amplitude and width which are independent of the frequency of the applied signal. The repetition rate of the pulses is proportional to the frequency deviation of the input signal. The output signal produced by the pulse shaping network is then integrated by an integrating circuit to reproduce the demodulated information signal which, in the case of FM receivers, is the audio signal.

At present, however, these pulse shaping networks or "counter detector circuits" are limited to operations in the region of from 100 kc. to 2 mc. The conventional intermediate frequency of 10.7 mc. of FM tuners would require reduction to a frequency in the range of 1 mc. in order to make demodulation by the pulse counting method feasible, and would necessitate the utilization of additional stages of oscillation and mixing, thereby increasing both the complexity of the circuits and the cost of the tuner.

It is an object of the invention to apply a pulse shaping network of this nature in connection with a frequency such as 10.7 mc., the intermediate frequency of FM receivers.

It is an object of the invention to utilize high speed transistors in networks to operate directly at the intermediate frequency of an FM receiver.

In such detectors, the amplitude of the signal is dependent in part on the pulse width, which is small. For instance, normally, at a frequency of ten megacycles, a pulse may have a duration of 100 nanoseconds; as to that portion of the pulse utilized in a counter detector, the useful width of the pulse may be only 50 nanoseconds; at the upper frequency of the band frequencies under consideration, that is, approximately 15 megacycles, the pulse width may be only 33 nanoseconds. This may be complicated further by the on-off time of the pulse-producing portion of the circuit, such as the transistor, and a resultant output voltage of very small value.

It is an object of the invention to provide an FM receiver detector which has extremely good long term stability, and which is not susceptible to frequency drift.

It is a further object of the invention to provide a counter detector for an FM receiver which is efficient in operation and economical to manufacture.

An embodiment of a counter detector constructed in accordance with the invention includes a first transistor which, at its output terminals, produces pulses having the same frequency as a frequency modulated signal which is applied across the input terminals thereof. A delay line is connected across the output terminals of the transistor to provide pulses having a width which is dependent on the delay time of the line only. The shield of the delay line is connected to the junction of the base of a second transistor, and to a resistor the other end of which is connected to ground. The values of this resistor and the collector resistor of the first transistor are chosen to be equal to the characteristic impedance of the delay line. Thus, when the first transistor is cut off by the input FM signal, the delay line will charge through the collector resistor of the first transistor and maintain the second transistor in conduction. When the first transistor conducts, the delay line will discharge through the resistor connected to the junction. Hence, since the delay line is terminated in its characteristic impedance during charging and discharging thereof, reflection signals will be eliminated, thereby substantially to eliminate the generation of unwanted spurious signals. Moreover, by suitably choosing the second transistor to withstand higher collector biasing potentials and to have a relatively slow switching time, it is possible to increase both the amplitude and width of the pulses appearing across its output terminals, thereby to provide higher output signals than was possible heretofore.

In a modified embodiment, a diode may be used. The circuit will operate in a manner similar to the operation of the circuit heretofore described.

Accordingly, a counter detector for an FM receiver is provided wherein delay means produce pulses of substantially longer duration, but at the same repetition rate as the applied FM signal, so as to derive a greater potential output signal from the detector.

Other objects of the invention will be set forth hereinafter, or will be apparent from the description and the drawings, in which are illustrated embodiments exemplifying the invention.

The invention, however, is not intended to be restricted to any particular construction, or any particular arrangement of parts, or any particular application of any such construction or arrangement of parts, or any specific method of operation or use, or any of the various details thereof, even where specifically shown and described herein, as the same may be modified in various particulars, or may be applied in many varied relations, without departing from the spirit and scope of the claimed invention, of which the exemplifying embodiments, herein shown and described, are intended only to be illustrative, and only for the purpose of complying with the requirements of the statutes for disclosure of an operative embodiment, but not to show all the various forms and modifications in which the invention might be embodied.

On the drawings, in which the same reference characters refer to the same parts throughout, and in which are disclosed such practical constructions:

The output signal from a counter detector to be applied to the integrating circuit is intended to have a certain minimum energy content so that the amplitude of the voltage signal derived from the integrating circuit may not be so small as to reduce its usefulness in an FM receiver. The signal derived from the integrating circuit is a function of the amplitude, width and repetition rate (or frequency) of the pulses produced by the counter detector, so that, for an increase in the amplitude of the demodulated signal appearing at the output terminals of the integrating circuit, one of these properties of the pulses must be varied accordingly. The frequency of the pulses is not such a variable since the repetition rate of the pulses is in direct proportion to the frequency duration of the applied FM signal. The amplitude of the pulses is directly variable according to the value of the biasing source for the transistors; this value normally is fixed; in the case here being considered, that value is approximately 20 or 25 volts. On the other hand, the duration of the pulses may be increased substantially (as long as the duration of the pulse is not greater than the period of the input signal) so as to produce, at the output terminals of the integrating circuit, signals of an amplitude substantially greater than output signals heretofore obtainable.

Figure 1:
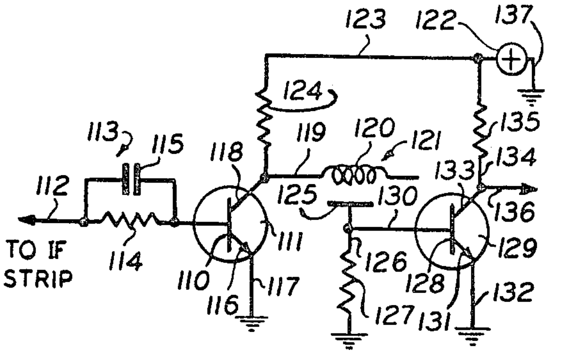
FIG. 1 is a schematic circuit wiring diagram of a counter detector embodying features of the invention.

An embodiment of a counter detector constructed according to the present invention is illustrated in FIG. 1, and includes a transistor or variable impedance 111, the base 110 of which is adapted to be connected to the intermediate frequency (IF) strip of an FM receiver (not shown) through the parallel resistor-capacity (RC) circuit 113 of resistor 114 and capacitor 115. The emitter 116 of transistor 111 is connected to ground by a lead 117. The collector 118 of transistor 111 is connected by a lead 119 to the central conductor 120 of an open circuited coaxial cable type delay line 121; collector 118 is also connected to a source of potential 122 by a lead 123. A collector resistor 124 is serially connected in lead 123 between collector 118 and source 122, and has a resistance equal to the characteristic impedance of delay line 121.

Shield 125 of delay line 121 is connected by a lead 126 to ground through a resistor 127 selected to have a resistance equal to the characteristic impedance of delay line 121. Base 128 of a transistor or variable impedance 129, by a lead 130, is connected directly to lead 126 between shield 125 and resistor 127. Emitter 131 of transistor 129 is connected to ground by a lead 132; the collector 133 of transistor 129 is connected by a lead 134 to lead 123 through a collector resistor 135. Collector 133 is also connected to an integrating circuit (not shown) by a lead 136.

Figure 2:
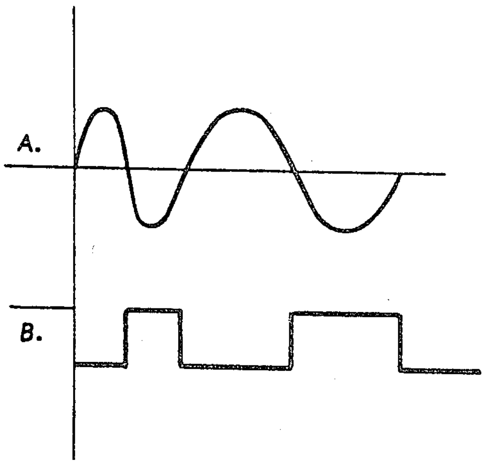
FIGS. 2A and 2B are graphic illustrations of waveforms appearing at different points in the circuit of FIG. 1.

In operation, an FM signal (as represented in FIG. 2A) from the IF strip of the FM tuner or receiver is applied to base 110 of transistor 111 through RC circuit 113. The waveform illustrated, as the other illustrated, is depicted with reference to ground potential. Thus, the wave applied to base 110 will vary about a frequency, such as the intermediate frequency of 10.7 megacycles, in accordance with the information modulated thereon.

When base 110 becomes positive with respect to emitter 116, transistor 111 begins to conduct, and the potential at collector 118 suddenly drops from a value equal to the potential of source 122 to a potential which is substantially zero (represented by the waveform in FIG. 2B). Thus, transistor 111 produces at collector 118 negative going pulses which have the same repetition rate as the applied FM signal.

When transistor 111 is turned off by either a negative going pulse or zero potential applied to base 110, the potential at collector 118 will rise to the potential of source 122. Thus, transistor 129 will be turned on and delay line 121 will charge, in the same manner as a capacitor, through the circuit comprising ground, lead 137, source 122, lead 123, resistor 124 (which is equal in value to the characteristic impedance of delay line 121), delay line 121, lead 130, the base-emitter path of transistor 129, and lead 132 to ground. In essence, therefore, the delay line 121 will charge through its characteristic impedance as represented by resistor 124.

However, unlike a capacitor, delay line 121 will charge for a period equal to twice the delay time of the single straight delay time of the line; that is, for the delay line to be fully charged, the signal travels down the delay line for a time T, reaches the open circuited terminals at the end thereof, and is reflected and travels back to the input terminals in another time interval T. Hence, the total charging time is equal to 2T. Thus, transistor 129 will be conducting for a time interval equal to twice the delay introduced by delay line 121 plus an interval of time owing to the storage effect of the minority carriers in transistor 129. As noted above, the wave applied to delay line 121 will travel down line 121 and be reflected back in phase with the original wave until the signal reaches the input terminals of line 121. At that time, current will cease flowing through the charging circuit since delay line 121 will be charged to the same potential as the applied potential. It is to be noted that twice the delay introduced by delay line 121 will not be quite as long as one-half the period of the signal at the lowest frequency of interest. Hence, delay line 121 delays the termination of the pulses produced by transistor 111 to cause transistor 129 to produce "stretched" pulses.

When transistor 111 is again turned on by a positive going signal applied to base 110, delay line 121 will discharge through the circuit comprising ground, resistor 127 (which is equal in value to the characteristic impedance of the delay line), lead 126, shield 125, conductor 120, lead 119, the collector-emitter path of transistor 111, lead 117, and ground. Thus, for each complete cycle of operation of the counter detector here described, transistor 129 produces pulses at collector 133 having a width equal to twice the delay time of delay line 121, plus a time interval owing to the storage time of the minority carriers in transistor 129. In essence, delay line 121 terminates the pulses after a time interval of 2T so that transistor 129 conducts for an interval of 2T plus the minority carrier storage time. These output pulses are applied to an integrating circuit (not shown) via lead 136 to reproduce in the conventional manner the audio information signal with which the original FM signal had been modulated.

It should be noted that the pulse width of the pulses appearing at collector 133 will be substantially greater than the width of the pulses appearing at collector 118; however, the repetition rate of the pulses appearing at collector 133 will be the same as the repetition rate of the pulses appearing at collector 118. Accordingly, the signal produced by the integrating circuit connected to collector 133 will be correspondingly greater in amplitude owing to the increased width of the output pulses from the counter detector here described. Additionally, the value of transistor 129 may be chosen to have a long storage time further to increase the pulse width appearing at collector 133.

Accordingly, the detector described produces an output voltage pulse of substantially increased deviation, and includes a delay line which is charged and discharged through resistances equal to the characteristic impedance of the delay line, and thereby reduces mismatching and subsequent distortion of the demodulated audio signal.

Figure 3:
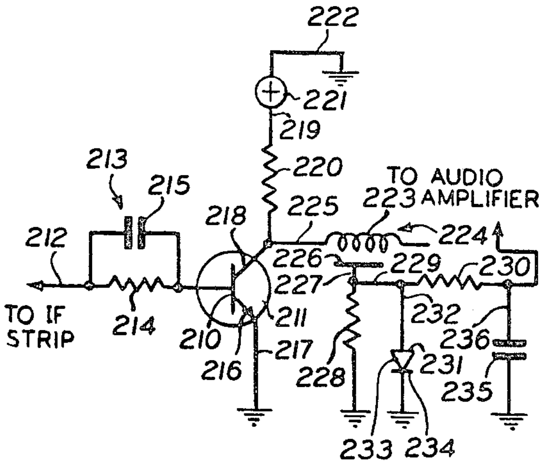
FIG. 3 is a schematic circuit wiring diagram of a modified counter detector embodying features of the invention.

A modified embodiment of a counter detector is illustrated in FIG. 3, and comprises a circuit wherein a delay line is charged and discharged through resistors equal in value to the characteristic impedance of the delay line. Thus, base 210 of a transistor or variable impedance 211 is adapted to be connected to the IF strip (not shown) of an FM receiver by a lead 212 through the RC parallel circuit 213 of resistor 214 and capacitor 215. The emitter 216 of transistor 211 is connected to ground by a lead 217; the collector 218 of transistor 211 is connected by a lead 219 and through a collector resistor 220, to one terminal of a source of potential 221. The other terminal of source 221 is connected to ground by a lead 222. Collector 218 is connected also to the central conductor 223 of an open circuited coaxial cable type delay line 224 by a lead 225. The value of the resistance of resistor 220 is chosen so it will be equal to the characteristic impedance of delay line 224.

Shield 226 of delay line 224 is connected to ground by a lead 227 through a resistor 228. The resistance of resistor 228 is selected to be equal to the characteristic impedance of delay line 224. A lead 229 connects the junction of shield 226 and resistor 228 to the input of an audio amplifier (not shown) through a serially connected resistor 230. A diode 231 is connected in parallel with resistor 228 by a lead 232; the anode 233 of diode 231 is connected to lead 229, and the cathode 234 of diode 231 is connected to ground. A capacitor 235 is connected by a lead 236 and resistor 230 to lead 229, to the audio amplifier, and to ground. Resistor 230 and capacitor 235 form a conventional integrating circuit which integrates the pulses appearing on lead 229.

In operation, when transistor 211 has been turned off either by a negative going pulse applied to base 210, or by zero potential appearing at base 210, delay line 224 will charge through the circuit comprising ground, lead 222, source 221, lead 219, resistor 220 (which is equal in value to the characteristic impedance of delay line 224), lead 225, delay line 224, shield 226, leads 227, 229, and 232, and diode 231 to ground. Delay line 224 will charge for a period of time equal to twice the delay introduced by the delay line (i.e., the time required for the pulse to travel down the line and be reflected back to the input terminals). However, when transistor 211 is turned on by a positive going pulse applied between base 210 and ground, delay line 224 will discharge through the circuit comprising ground, resistor 228, lead 227, delay line 224, lead 225, and the collector-emitter path of transistor 211. The pulse appearing on lead 229 will exist for an interval of time equal to twice the delay time introduced by delay line 224 plus the time interval transistor 211 is in its conducting state. Twice the delay time of delay line 224 is slightly less than one-half the period of the wave at the lowest frequency of interest. This pulse will be integrated by the circuit comprising resistor 230 and capacitor 235, and will be applied to the audio amplifier in the conventional manner.

The detector here described for an FM receiver does not rely upon the use of tuned circuits for its operation, and can operate at the conventional intermediate frequency of FM receivers, to produce a substantial output audio voltage signal which can then be amplified by the audio amplifier in a conventional manner to reproduce the signal modulated on the carrier wave.

Many other changes could be effected in the particular constructions, and in the methods of use and construction, and in specific details thereof, hereinbefore set forth, without substantially departing from the invention intended to be defined herein, the specific description being merely of embodiments capable of illustrating certain principles of the invention.

What is claimed as new and useful is:

1. A demodulator for demodulating an FM signal modulated by signal information, comprising first pulse producing means adapted to be connected to the intermediate frequency amplifier of an FM receiver for producing pulses having the same repetition rates as the frequency of the FM signal, second pulse producing means responsive to pulses from said first pulse producing means for producing output pulses, an open-circuited delay line connecting said first pulse producing means with said second pulse producing means for delaying the termination of pulses applied to said second pulse producing means to cause said second pulse producing means to produce stretched pulses, and integrating means connected to said second pulse producing means for integrating said output pulses to obtain the signal information with which the FM signal was modulated.

2. A demodulator as in claim 1, in which said integrating means includes a series circuit of a resistor and a capacitor, and means for connecting the input of an amplifier in parallel with said capacitor.

3. A demodulator as in claim 1, in which said first pulse producing means includes a first transistor having an input electrode, an output electrode, and a control electrode for having the FM signal impressed thereon; said second pulse producing means including a second transistor having an input electrode, an output electrode and a control electrode; said delay line connecting the output electrode of the first transistor to the control electrode of the second transistor.

4. A demodulator as in claim 3, in which said delay line includes a central conductor and a shield, said central conductor being connected to said output electrode of said first transistor, and said shield being connected to the control electrode of said second transistor.

5. A demodulator as in claim 1, in which said delay line has a delay wherein twice the relay introduced by said delay line is lower than one-half the period of the signal at the lowest frequency of interest.

References Cited

UNITED STATES PATENTS

| | | | |
|---|---|---|---|
| 2,707,751 | 5/1955 | Hance | 328—58 |
| 3,036,272 | 5/1962 | Le Vezu | 328—56 X |
| 3,175,101 | 3/1965 | Van Dine. | |
| 3,252,100 | 5/1966 | Webb. | |
| 3,345,576 | 10/1967 | Gyi | 329—103 |

ALFRED L. BRODY, *Primary Examiner.*

U.S. Cl. X.R.

307—233, 235, 265, 293; 325—325, 349; 328—56, 58, 111; 329—110, 126